United States Patent
Jang

(10) Patent No.: US 10,109,649 B2
(45) Date of Patent: Oct. 23, 2018

(54) ORGANIC LIGHT-EMITTING DISPLAY APPARATUS FOR IMPROVING AN ADHESION OF A SEALING MEMBER

(71) Applicant: Samsung Display Co., Ltd., Yongin-si, Gyeonggi-do (KR)

(72) Inventor: Joonyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 32 days.

(21) Appl. No.: 15/162,435

(22) Filed: May 23, 2016

(65) Prior Publication Data
US 2017/0077192 A1    Mar. 16, 2017

(30) Foreign Application Priority Data
Sep. 11, 2015   (KR) .................. 10-2015-0129093

(51) Int. Cl.
| | | |
|---|---|---|
| H01L 29/08 | (2006.01) | |
| H01L 27/12 | (2006.01) | |
| H01L 51/52 | (2006.01) | |
| H01L 27/32 | (2006.01) | |

(52) U.S. Cl.
CPC ...... H01L 27/1222 (2013.01); H01L 27/1237 (2013.01); H01L 27/3244 (2013.01); H01L 51/5246 (2013.01); *H01L 27/323* (2013.01)

(58) Field of Classification Search
CPC ............ H01L 27/1222; H01L 51/5246; H01L 51/5243; H01L 27/1237; G02F 1/13458
See application file for complete search history.

(56) References Cited

U.S. PATENT DOCUMENTS

| | | | | |
|---|---|---|---|---|
| 2003/0038913 A1* | 2/2003 | Choo | .................... | G02F 1/1339 349/149 |
| 2004/0183989 A1* | 9/2004 | Kim | .................... | G02F 1/13394 349/155 |
| 2005/0067953 A1* | 3/2005 | Yamazaki | ........... | H01L 27/3246 313/506 |
| 2005/0195355 A1* | 9/2005 | Kwak | ................. | H01L 51/5246 349/149 |

(Continued)

FOREIGN PATENT DOCUMENTS

| | | |
|---|---|---|
| KR | 10-2010-0009208 A | 1/2010 |
| KR | 10-2012-0032250 A | 4/2012 |

(Continued)

*Primary Examiner* — Thao X Le
*Assistant Examiner* — Laura Dykes
(74) *Attorney, Agent, or Firm* — Lewis Roca Rothgerber Christie LLP

(57) ABSTRACT

An organic light-emitting display apparatus includes a first substrate corresponding to a display area and a periphery area, a second substrate facing the first substrate, a first metal layer at the periphery area of the first substrate, and defining a plurality of first holes, a second metal layer on the first metal layer, and defining a plurality of second holes that are differently sized than the first holes, a third metal layer on the second metal layer, and defining a plurality of third holes that are differently sized than the second holes, and a sealing member bonding the first substrate and the second substrate, and filling a partial region of the first, second, and third holes.

12 Claims, 8 Drawing Sheets

(56) References Cited

U.S. PATENT DOCUMENTS

2006/0139505 A1* 6/2006 Yoshinaga ............ G02F 1/1345
349/43
2010/0011566 A1  1/2010 Kim et al.
2012/0074838 A1  3/2012 Im et al.
2012/0106044 A1  5/2012 Kwon et al.
2013/0099218 A1* 4/2013 Lee .................... H01L 51/5203
257/40

FOREIGN PATENT DOCUMENTS

KR  10-2012-0044021 A  5/2012
KR  10-2015-0042622 A  4/2015

\* cited by examiner

| | A | B | C |
|---|---|---|---|
| ESD LIMITATION VALUE | +19kV | +8kV | +10kV |
| HEATING AREA AT $2\times10^{15}W/m^3$ |  |  |  |

ORGANIC LIGHT-EMITTING DISPLAY APPARATUS FOR IMPROVING AN ADHESION OF A SEALING MEMBER

CROSS-REFERENCE TO RELATED APPLICATION

This application claims the benefit of Korean Patent Application No. 10-2015-0129093, filed on Sep. 11, 2015, in the Korean Intellectual Property Office, the disclosure of which is incorporated herein in its entirety by reference.

BACKGROUND

1. Field

Embodiments of the present disclosure relate to an organic light-emitting display apparatus.

2. Description of the Related Art

Display apparatuses provide visual information, such as an image or a video provided to a user. The display apparatuses have been manufactured in various forms to represent visual information, such as an image or a video.

Organic light-emitting display apparatuses are self-emission display apparatuses for emitting light by electrically exciting an organic compound, and may be driven at a low voltage. They may be formed to be thin, to have wide view angles, to have quick response times, and the like, and thus the organic light-emitting display apparatuses are spotlighted as next-generation display apparatuses that may solve problems of liquid crystal display apparatuses.

Organic light-emitting display apparatuses may have a sealing member that is used when bonding a lower substrate and an upper substrate. The region in which the sealing member may be placed may be a dead space in which an image cannot be displayed.

If the dead space is reduced, a possibility of the occurrence of delamination may be high.

SUMMARY

One or more embodiments include an organic light-emitting display apparatus for reducing delamination of a sealing member while reducing a dead space.

One or more embodiments include an organic light-emitting display apparatus for improving an adhesion of a sealing member.

Additional aspects will be set forth in part in the description that follows and, in part, will be apparent from the description, or may be learned by practice of the presented embodiments.

According to one or more embodiments, an organic light-emitting display apparatus includes a first substrate corresponding to a display area and a periphery area, a second substrate facing the first substrate, a first metal layer at the periphery area of the first substrate, and defining a plurality of first holes, a second metal layer on the first metal layer, and defining a plurality of second holes that are differently sized than the first holes, a third metal layer on the second metal layer, and defining a plurality of third holes that are differently sized than the second holes, and a sealing member bonding the first substrate and the second substrate, and filling a partial region of the first, second, and third holes.

A size of one of the second holes may be larger than a size of at least one of the first or third holes.

A size of one of the first holes may be the same as a size of one of the third holes.

A size of one of the first holes may be smaller than a size of one of the second holes, and may be smaller than a size of one of the third holes.

At least one of the first and the third holes may overlap one of the second holes.

The second metal layer may contact the first metal layer.

The second metal layer may contact the third metal layer.

A first insulating layer may cover the first metal layer.

The first insulating layer may surround a side surface of a portion of the second metal layer, and may expose an upper surface of the second metal layer.

The first insulating layer may define a fourth hole within the first and second holes.

The sealing member may fill the fourth hole.

The first insulating layer may include a same material as a gate insulating layer at the display area.

A second insulating layer may cover the third metal layer.

A material of the second insulating layer may be different from a material of the first insulating layer.

The second insulating layer may include the same material as an interlayer insulating layer at the display area.

At least two of the first, second, or third metal layers may include a same material.

At least one of the first, second, or third metal layers may include a same material as an electrode of a capacitor at the display area.

A first substrate may include a display area and a periphery area, a second substrate may face the first substrate, a metal layer at the periphery area, and may define a plurality of first through holes, and a sealing member for bonding the first substrate and the second substrate, and filling a partial region of the first through holes, a cross-sectional size of a center region of the first through hole may be larger than a cross-sectional size of each of both ends of the first through hole.

An insulating layer may cover the metal layer and may define a second through hole overlapping a partial region of the first through hole.

The sealing member may fill the second through hole.

BRIEF DESCRIPTION OF THE DRAWINGS

These and/or other aspects will become apparent and will be more readily appreciated from the following description of the embodiments, taken in conjunction with the accompanying drawings, in which.

DETAILED DESCRIPTION

Figure 1:
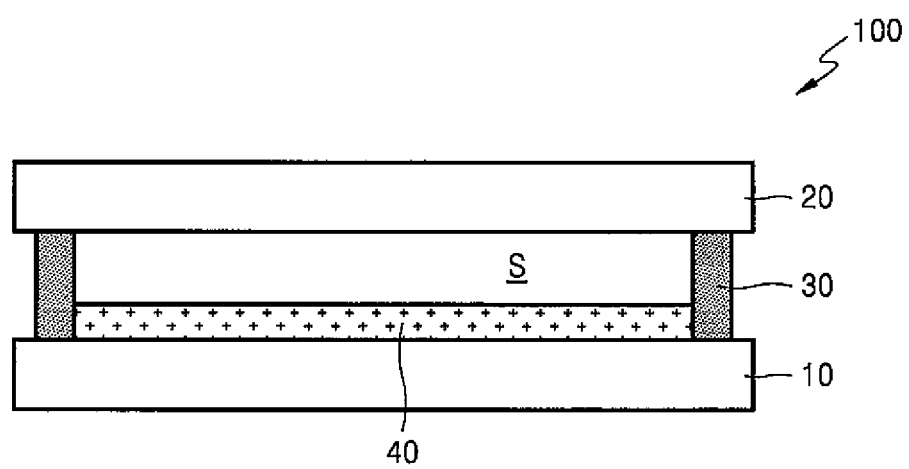
FIG. 1 illustrates a configurational diagram of a display apparatus according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the embodiments below, a display apparatus is referred to as an organic light-emitting display apparatus but is not limited to any one of display apparatuses for realizing an image by receiving power, e.g., a liquid crystal display (LCD) apparatus, a field emission display (FED) apparatus, an electronic paper display (EPD) apparatus, and the like.

Figure 2:
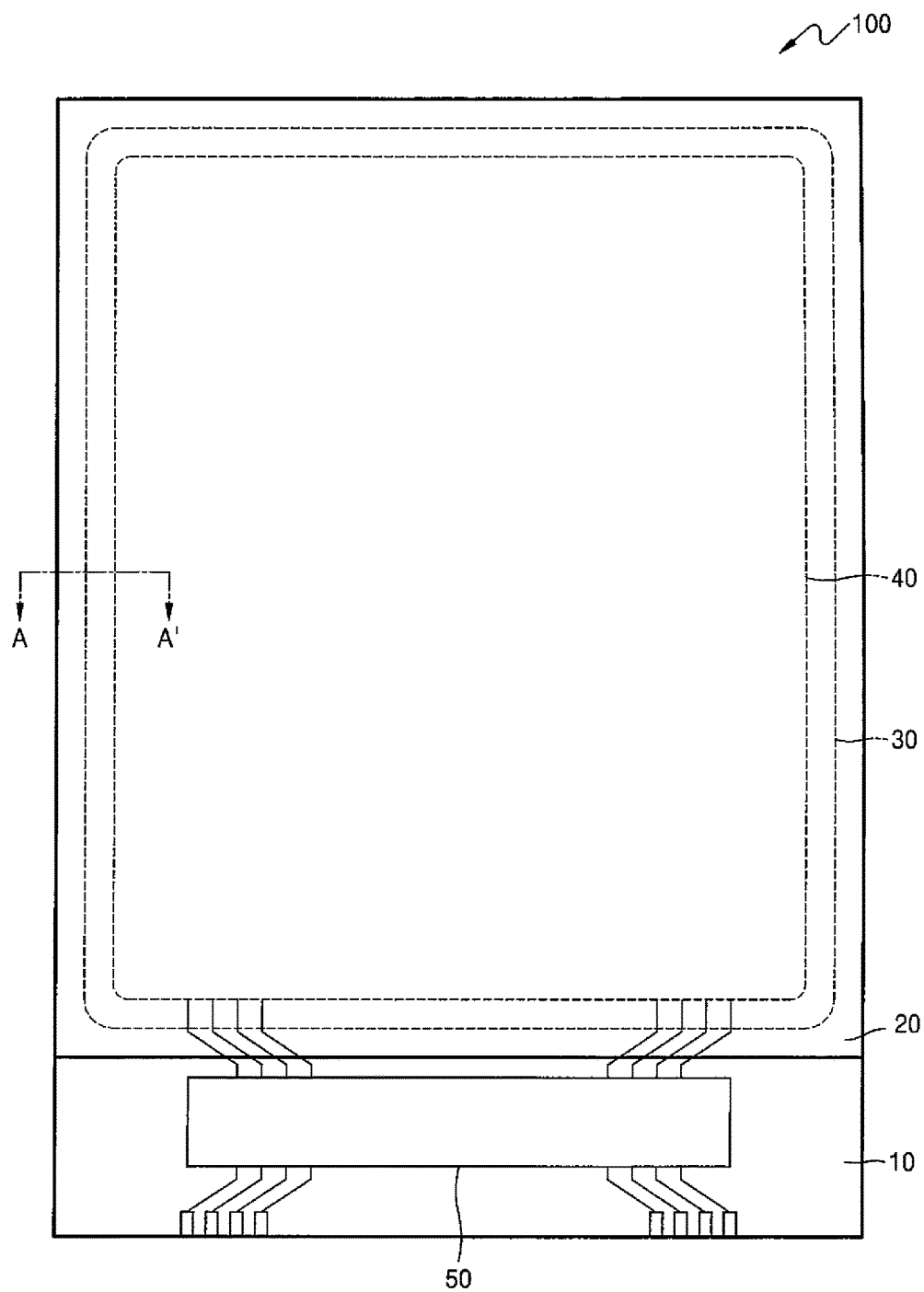
FIG. 2 illustrates a top view of the display apparatus of FIG. 1.

FIG. 1 illustrates a configurational diagram of a display apparatus 100 according to an embodiment, and FIG. 2 illustrates a top view of the display apparatus 100 of FIG. 1.

Referring to FIGS. 1 and 2, the display apparatus 100 may include a first substrate 10 including (e.g., corresponding to) a display area 40, a second substrate 20 facing the first substrate 10, and a sealing member 30 surrounding the display area 40 and bonding the first substrate 10 and the second substrate 20.

The first substrate 10 may be formed of a transparent glass material of which silicon oxide ($SiO_2$) is a main component. However, the first substrate 10 may also be formed of a transparent plastic material. The first substrate 10 may be a flexible substrate, and may be fabricated using a material that is light-weight due to having a smaller specific gravity than a glass substrate, and has strong and bendable characteristics. As a non-limiting example, such a material may be a polymer material, such as a flexible plastic film.

Figure 3:
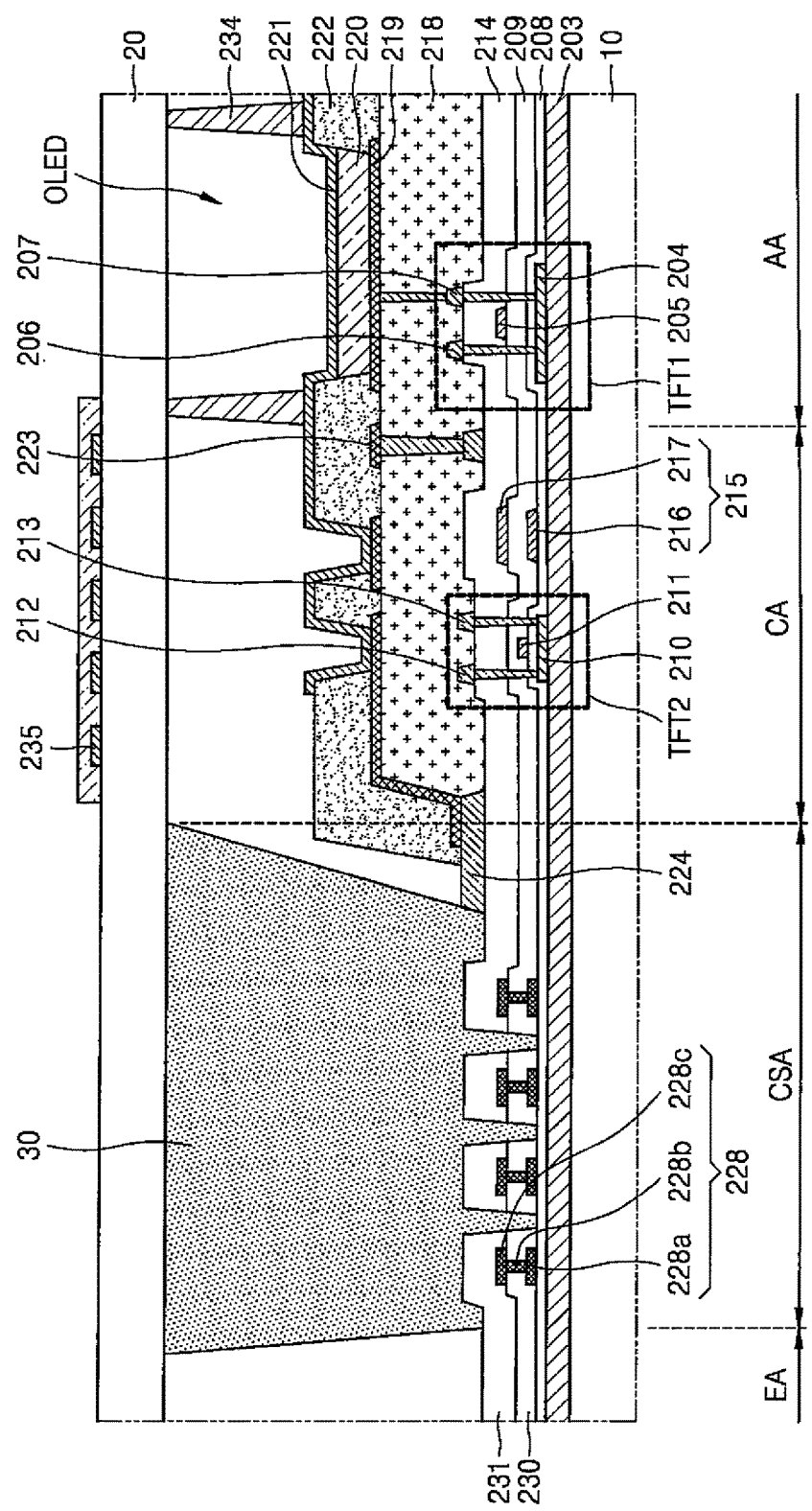
FIG. 3 illustrates a magnified cross-sectional view of a portion of the display apparatus of FIG. 1.

The display area 40 of the first substrate 10 may include driving thin-film transistors TFT1 and TFT2, a capacitor 215, an organic light-emitting device OLED, and the like (see FIG. 3). The display area 40 will be described in detail below.

The second substrate 20 may correspond to the first substrate 10, and may be formed of one of various materials, such as glass, a metallic material, or plastic. A functional layer for performing various functions may be formed on the second substrate 20. As a non-limiting example, the functional layer may include at least one of a polarizing plate, a touch screen, or a cover window.

The touch screen may have a structure in which a touch screen pattern is directly formed on the second substrate 20, such as a cell touch screen panel. The polarizing plate may prevent external light from being reflected from the display area 40. The cover window may protect the display apparatus.

The first substrate 10 and the second substrate 20 may be bonded through the sealing member 30. The sealing member 30 may contact a portion of the display area 40, and may seal the display area 40 from the outside. Accordingly, the sealing member 30 may protect the display area 40 from the outside (e.g., external impurities). A moisture absorbent, a filler, or the like may be filled in an internal space S that is sealed by the first substrate 10, the second substrate 20, and the sealing member 30.

A portion of the sealing member 30 may contact a portion of the display area 40, thereby reducing a dead space due to the sealing member 30, and thereby maintaining an area of the display area 40.

A pad unit 50 may be mounted on an edge of the first substrate 10 that is not covered by the second substrate 20. A metal wiring for connecting the pad unit 50 and the display area 40 may be between the first substrate 10 and the sealing member 30.

The sealing member 30 may be formed of a material melted by applying thermal energy. The sealing member 30 may include a material cured by light. As a non-limiting example, the sealing member 30 may include glass frit.

As a non-limiting example, after aligning the first substrate 10 and the second substrate 20, light, such as ultraviolet (UV) rays or laser beams, may be irradiated on the second substrate 20. According to the irradiation of light, the sealing member 30 may be melted, thereby bonding the first substrate 10 and the second substrate 20. Because the sealing member 30 may be compressed while being melted, the thickness of the sealing member 30 may be reduced.

Figure 4:
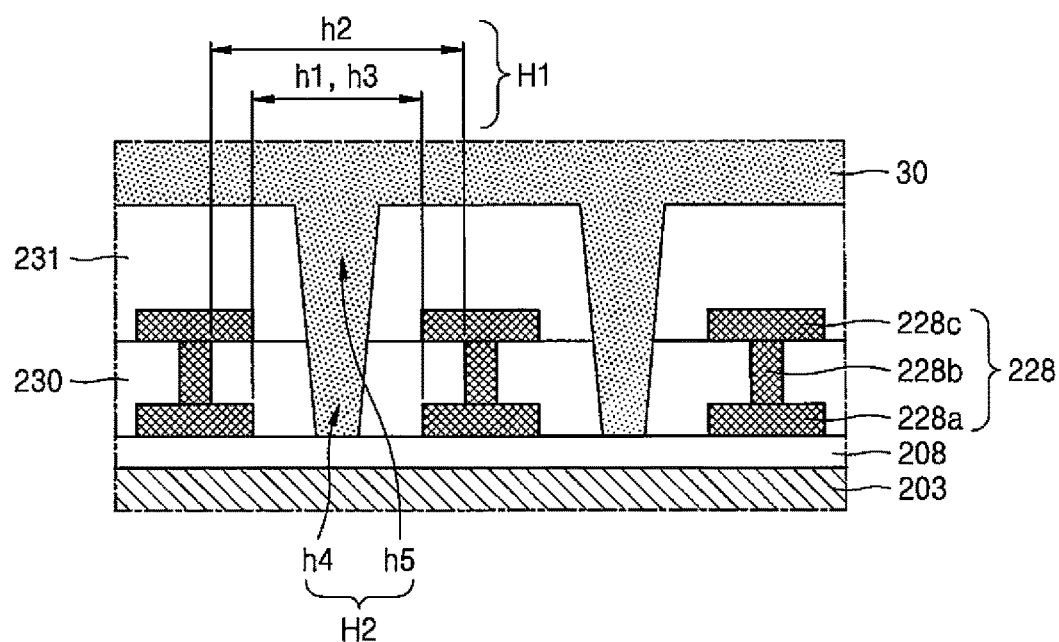
FIG. 4 illustrates a magnified cross-sectional view of a periphery area including a metal layer of FIG. 3.
Figure 5:
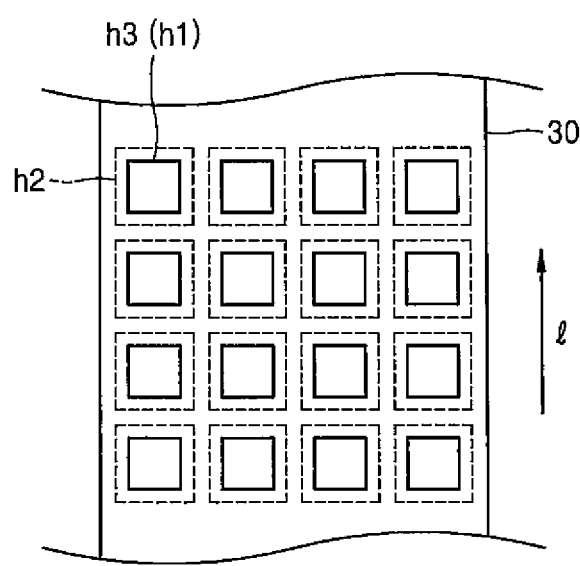
FIG. 5 illustrates a magnified top view of the periphery area including the metal layer of FIG. 3.

FIG. 3 illustrates a magnified cross-sectional view of a portion of the display apparatus 100 of FIG. 1, FIG. 4 illustrates a magnified cross-sectional view of a periphery area including a metal layer of FIG. 3, and FIG. 5 illustrates a magnified top view of the periphery area including the metal layer of FIG. 3.

The first substrate 10 may include, or may correspond to, an active area AA, a circuit area CA extending toward the active area AA, and a cell seal area CSA extending toward the circuit area CA. An edge area EA, which may include a cutting area, may be formed extending toward the cell seal area CSA. The active area AA and the circuit area CA may form the display unit, and the other areas CSA, EA may form the periphery area.

The active area AA may include an area in which an image is displayed, the circuit area CA may include an area in which a circuit pattern for exchanging electrical signals with components in the active area AA. The cell seal area CSA may include an area in which the first substrate 10 and the second substrate 20 are bonded.

A buffer layer 203 may be on the first substrate 10. The buffer layer 203 may smooth, or planarize, a surface of the first substrate 10, and may prevent infiltration of moisture or external air. The buffer layer 203 may also include an inorganic layer, such as silicon oxide, or an organic layer, such as polyimide, or may have a stacked structure of the inorganic layer and the organic layer.

At least one thin-film transistor may be formed in each of the active area AA and the circuit area CA (e.g., thin-film transistors TFT1 and TFT2). In the present embodiment, an example in which different types of thin-film transistors are formed in the active area AA and the circuit area CA, is described, but only for illustrative purposes, and the present embodiment is not limited thereto.

A first thin-film transistor TFT1 in the active area AA may include a first semiconductor active layer 204, a first gate electrode 205, a first source electrode 206, and a first drain electrode 207. A first gate insulating layer 208 and a second gate insulating layer 209 for insulating between the first gate electrode 205 and the first semiconductor active layer 204 may be interposed between the first gate electrode 205 and the first semiconductor active layer 204.

A second thin-film transistor TFT2 in the circuit area CA may include a second semiconductor active layer 210, a second gate electrode 211, a second source electrode 212, and a second drain electrode 213. The first gate insulating layer 208, which is for insulating between the second semiconductor active layer 210 and the second gate electrode 211, may be interposed between the second semiconductor active layer 210 and the second gate electrode 211.

When comparing the first thin-film transistor TFT1 with the second thin-film transistor TFT2, the first thin-film transistor TFT1 may further include the second gate insulating layer 209 between the first semiconductor active layer 204 and the first gate electrode 205. That is, the first thin-film transistor TFT1 may have a thicker insulating layer than the second thin-film transistor TFT2. With the thicker insulating layer, a driving range of a gate voltage to be applied to the first gate electrode 205 may be wider.

The first thin-film transistor TFT1 may be a driving thin-film transistor for driving an organic light-emitting device OLED. A wide driving range of the driving thin-film transistor may indicate that light emitted from the organic light-emitting device OLED may be controlled to have a rich gradient.

The first gate electrode 205 and the second gate electrode 211 are not in the same layer. Therefore, even though the first thin-film transistor TFT1 and the second thin-film transistor TFT2 are adjacent, no interference occurs, and thus a greater number of components may be in a same area.

The first semiconductor active layer 204 and the second semiconductor active layer 210 may be on the buffer layer 203. An inorganic semiconductor, such as amorphous silicon or polysilicon or an organic semiconductor, may be used for the first semiconductor active layer 204 and the second semiconductor active layer 210.

In an embodiment of the present invention, the first semiconductor active layer 204 and the second semiconductor active layer 210 may be formed of an oxide semiconductor. As a non-limiting example, the oxide semiconductor may include an oxide of a material selected from among 4-, 12-, 13-, and 14-group metal elements, such as zinc (Zn), indium (In), gallium (Ga), tin (Sn), cadmium (Cd), germanium (Ge), and hafnium (Hf) and/or a combination thereof.

The first gate insulating layer 208 may be on the buffer layer 203, and may cover the first semiconductor active layer 204 and the second semiconductor active layer 210.

The second gate electrode 211 may be on the first gate insulating layer 208, and may overlap a portion of the second semiconductor active layer 210.

The second gate insulating layer 209 may cover the second gate electrode 211.

The first gate electrode 205 may be on the second gate insulating layer 209, and may overlap a portion of the first semiconductor active layer 204.

The first gate electrode 205 and the second gate electrode 211 may include a monolayer including gold (Au), silver (Ag), copper (Cu), nickel (Ni), platinum (Pt), palladium (Pd), aluminum (Al), molybdenum (Mo), chromium (Cr), or the like, may include a multi-layer, or may include an alloy such as Al:neodymium (Nd) or Mo:tungsten (W).

The first gate insulating layer 208 and the second gate insulating layer 209 may include an inorganic layer including silicon oxide, silicon nitride, and/or metal oxide. The first gate insulating layer 208 and the second gate insulating layer 209 may be formed as a monolayer or as a multi-layer.

An interlayer insulating layer 214 may be formed to cover the first gate electrode 205. The interlayer insulating layer 214 may be an inorganic layer including silicon oxide, silicon nitride, or the like. In an embodiment of the present invention, the interlayer insulating layer 214 may be an organic layer including polyimide or the like.

The first source electrode 206 and the first drain electrode 207 may be on the interlayer insulating layer 214, and may contact the first semiconductor active layer 204 through contact holes.

The first source electrode 206, the second source electrode 212, the first drain electrode 207, and the second drain electrode 213 may include a metal, an alloy, a metal nitride, a conductive metal oxide, a transparent conductive material, and/or the like.

The above-described structure of thin-film transistors is not limited thereto, and various structures of thin-film transistors may be applicable. Although the thin-film transistors TFT1 and TFT2 described above have a top-gate structure, the thin-film transistors may instead have a bottom-gate structure in which the first gate electrode 205 is under the first semiconductor active layer 204.

A capacitor 215 may be formed in the circuit area CA. A plurality of capacitors may also be formed in the active area AA. The capacitor 215 may include a first capacitor electrode 216, a second capacitor electrode 217, and a portion of the second gate insulating layer 209 interposed between the first capacitor electrode 216 and the second capacitor electrode 217. The first capacitor electrode 216 may be formed of the same material as the second gate electrode 211, and the second capacitor electrode 217 may be formed of the same material as the first gate electrode 205.

A planarization layer 218 may cover the first and second thin-film transistors TFT1 and TFT2 and the capacitor 215. The planarization layer 218 is on the interlayer insulating layer 214. The planarization layer 218 may remove a step difference between first and second thin-film transistors TFT1 and TFT2, and may planarize upper surfaces of the first and second thin-film transistors TFT1 and TFT2 to increase emission efficiency of the organic light-emitting device OLED to be formed on the planarization layer 218. In an embodiment of the present invention, the planarization layer 218 may have a through hole through which a portion of the first drain electrode 207 is exposed.

The planarization layer 218 may be formed of an insulator. As a non-limiting example, the planarization layer 218 may be formed in a monolayer, or may be formed in a multi-layer structure including an inorganic material, an organic material, or an organic/inorganic composition, and may be formed by various deposition methods.

The planarization layer 218 may be formed of an organic material, such as a polyacrylates resin, an epoxy resin, benzocyclobutene (BCB), or the like, or may be formed of an inorganic material, such as silicon nitride (Sit %) or the like.

Any one of the planarization layer 218 and the interlayer insulating layer 214 may be omitted.

The organic light-emitting device OLED may be on the planarization layer 218. The organic light-emitting device OLED may include a first electrode 219, an intermediate layer 220 including an organic emission layer, and a second electrode 221.

A pixel-defining layer 222 may cover a portion of the planarization layer 218 and the first electrode 219, and may define a pixel area and a non-pixel area.

The pixel-defining layer 222 may be formed of an organic material or an inorganic material. As a non-limiting example, the pixel-defining layer 222 may be formed of an organic material, such as polyimide, polyamide, BCB, an acryl resin, a phenol resin, or the like or an inorganic material such as $SiN_x$ or the like. The pixel-defining layer 222 may be formed as a monolayer or as a multi-layer.

Holes and electrons respectively injected from the first electrode 219 and the second electrode 221 of the organic light-emitting device OLED may be combined in the organic emission layer of the intermediate layer 220, thereby emitting light.

The intermediate layer 220 may include the organic emission layer. As another non-limiting example, the intermediate layer 220 may include the organic emission layer, and may further include at least one of a hole injection layer (HIL), a hole transport layer (HTL), an electron transport layer (ETL), and an electron injection layer (EIL). The present embodiment is not limited thereto, and the intermediate layer 220 may include the organic emission layer, and may further include other various functional layers.

The second electrode 221 may be on the intermediate layer 220. The second electrode 221 may form an electric field with the first electrode 219 so that the intermediate layer 220 emits light. The first electrode 219 may be patterned for each pixel, and the second electrode 221 may be formed such that a common voltage is applied to all pixels (e.g., may be formed as a common electrode).

The first electrode 219 and the second electrode 221 may be a transparent or reflective electrode. The first electrode 219 may function as an anode, and may be formed of various conductive materials, and the second electrode 221 may function as a cathode.

As a non-limiting example, when the first electrode 219 is used as a transparent electrode, the first electrode 219 may include a transparent conductive layer formed of indium tin oxide (ITO), indium zinc oxide (IZO), zinc oxide (ZnO), indium oxide ($In_2O_3$), or the like. When the first electrode 219 is used as a reflective electrode, the first electrode 219 may include a reflective layer formed of Ag, magnesium (Mg), Al, Pt, Pd, Au, Ni, Nd, iridium (Ir), Cr, a compound thereof, or the like and may include a transparent conductive layer formed of ITO, IZO, ZnO, and/or $In_2O_3$, or the like on the reflective layer.

As a non-limiting example, when the second electrode 221 is used as a transparent electrode, the second electrode 221 may be formed by depositing a metal having a small work function (e.g., lithium (Li), calcium (Ca), lithium fluoride (LiF)/Ca, LiF/Al, Al, Ag, Mg, and/or a compound thereof) on the intermediate layer 220, and by then further forming a transparent conductive layer of ITO, IZO, ZnO, and/or $In_2O_3$, or the like on the metal/compound. When the second electrode 221 is used as a reflective electrode, the second electrode 221 may be formed of Li, Ca, LiF/Ca, LiF/Al, Al, Ag, Mg, and/or a compound thereof.

Although the first electrode 219 may function as an anode, and although the second electrode 221 may function as a cathode, the present invention is not limited thereto. As such, the first electrode 219 may instead function as a cathode, and the second electrode 221 may instead function as an anode.

One pixel may be formed for each organic light-emitting device OLED, and a red, green, blue, or white color may be realized for each pixel. However, the present embodiment is not limited thereto. The intermediate layer 220 may be commonly formed for all first electrodes 219 regardless of positions of pixels. The organic emission layer may also be formed such that layers respectively including emission materials for emitting red, green, and blue lights are vertically stacked, or are mixed. Other colors may be combined if white light is emitted. In addition, a color conversion layer or a color filter for converting the emitted white light into a certain color may be further included.

A protective layer may be on the second electrode 221. The protective layer covers the organic light-emitting device OLED. The protective layer may include an inorganic insulating layer and/or an organic insulating layer.

A spacer 234 may be in the non-pixel area. The spacer 234 may be placed between the first substrate 10 and the second substrate 20. The spacer 234 may be provided to avoid damaging a display characteristic due to an external impact.

The second substrate 20 may be combined with the first substrate 10. The second substrate 20 may protect the organic light-emitting device OLED and other thin films from external moisture, oxygen, or the like.

The second substrate 20 may be a glass substrate, a polymer substrate, or a flexible film having rigidity. The second substrate 20 may have a structure in which an organic layer and an inorganic layer are alternately stacked.

A plurality of touch electrodes 235 may be on the second substrate 20 to function as a touch screen. In addition, a functional layer, such as a polarizing film, a color filter, or a cover window, may be further formed on the second substrate 20.

Various circuit patterns may be formed in the circuit area CA. As a non-limiting example, a power supply pattern, an anti-electrostatic pattern, and other various circuit patterns may be formed.

A circuit wiring 223 may be formed in the circuit area CA. The circuit wiring 223 may be on the planarization layer 218. The circuit wiring 223 may be formed of the same material as the first electrode 219. The circuit wiring 223 may be electrically connected to a component in the active area AA, such as the second electrode 221.

The circuit wiring 223 may be connected to a power wiring 224. The power wiring 224 may be on the interlayer insulating layer 214. The power wiring 224 may be formed of the same material as the first source electrode 206, the second source electrode 212, the first drain electrode 207, and the second drain electrode 213. The power wiring 224 may be a wiring through which external power may be applied. As a non-limiting example, the power wiring 224 may have a tri-layer structure including Ti/Al/Ti. Because the power wiring 224 is formed of a conductive material, the power wiring 224 may be a conductive layer. The circuit wiring 223 and the power wiring 224 may be in different layers.

As a non-limiting example, the circuit wiring 223 may be on the planarization layer 218. The circuit wiring 223 may be formed of the same material as the first electrode 219 in the same process as the first electrode 219. The power wiring 224 may be on the interlayer insulating layer 214. The power wiring 224 may be formed of the same material as the first source electrode 206, the second source electrode 212, the first drain electrode 207, and the second drain electrode 213, and may be formed during the same process as the first source electrode 206, the second source electrode 212, the first drain electrode 207, and the second drain electrode 213.

One end of the circuit wiring 223 may contact the power wiring 224. In an embodiment, at least a portion of the circuit wiring 223 may overlap the power wiring 224.

The sealing member 30 may be in the cell seal area CSA. The sealing member 30 may be located between the first substrate 10 and the second substrate 20. A portion of the sealing member 30 may be located around the circuit area CA while contacting the circuit area CA. As a non-limiting example, a portion of the sealing member 30 may contact the power wiring 224.

The sealing member 30 may include glass frit. The glass frit may include glass powder with oxide powder. A paste in a gel state may be produced by adding an organic material to the glass frit including oxide powder, and may be fired with a temperature range of about 300° C. to about 500° C. If the glass frit is fired, the organic material may be evaporated to the air, and the paste in a gel state may be cured, thereby generating frit in a solid state.

A metal layer 228 and first and second insulating layers 230 and 231 covering the metal layer 228 may be under the sealing member 30. The metal layer 228 may be at the periphery area (e.g., in the cell seal area CSA) of the substrate 10, and may include a plurality of first through holes H1 (see FIG. 4), and the first and second insulating layers 230 and 231 may cover the metal layer 228 and may include a second through hole H2 overlapping a partial region of each of the plurality of first through holes H1 (see FIG. 4). The metal layer 228 may transfer heat to the sealing member 30 by absorbing heat of laser beams or by reflecting laser beams.

As a non-limiting example, as shown in FIGS. 4 and 5, the metal layer 228 may be on the periphery area (CSA) of the substrate 10, and may include a first metal layer 228a including a plurality of first holes h1, a second metal layer 228b on the first metal layer 228a, and may include a plurality of second holes h2 that are differently sized from the first hole h1, and may include a third metal layer 228c on the second metal layer 228b, and may include a plurality of third holes h3 that are differently sized from the second hole h2.

The first metal layer 228a may be on the first gate insulating layer 208. The first metal layer 228a may include the same material as the first capacitor electrode 216 of the capacitor 215 in the display area 40, and may be on the same layer as the first capacitor electrode 216. The first capacitor electrode 216 may be formed of the same material as the second gate electrode 211.

The first metal layer 228a may include (e.g., may define) the plurality of first holes h1. The plurality of first holes h1 may be two-dimensionally arranged. The plurality of first holes h1 may have a same size, or at least two of the plurality of first holes h1 may have a different size. The size of the first hole h1 may be about 3 μm or more, and a distance between the first holes may be about 2.5 μm or more.

The second metal layer 228b may be on the first metal layer 228a. The second metal layer 228b may contact the first metal layer 228a. The second metal layer 228b may include (e.g., may define) the plurality of second holes h2. The plurality of second holes h2 may be two-dimensionally arranged. The plurality of second holes h2 may have a same size, or at least two of the plurality of second holes h2 may have a different size.

The size of the second hole h2 may be different from the size of the first hole h1. As a non-limiting example, the size of the second hole h2 may be larger than the size of the first hole h1. Even if the plurality of second holes h2 have different sizes, the size of each second hole h2 may be larger than the size of a corresponding first hole h1. A partial region of the second hole h2 may overlap the first hole h1.

The third metal layer 228c may be on the second metal layer 228b. The third metal layer 228c may contact the second metal layer 228b, and may be spaced apart from the first metal layer 228a. The third metal layer 228c may include the same material as the second capacitor electrode 217 of the capacitor 215 in the display area 40, and may be on the same layer as the second capacitor electrode 217. The second capacitor electrode 217 may be formed of the same material as the second gate electrode 211.

As a non-limiting example, at least one of the first, second, and third metal layers 228a, 228b, and 228c may be a monolayer, or a multi-layer including Au, Ag, Cu, Ni, Pt, Pd, Al, Mo, Cr, or the like. At least one of the first, second, and third metal layers 228a, 228b, and 228c may include an alloy such as Al:Nd or Mo:W.

According to the above-described structure of the first, second, and third holes h1, h2, and h3, the metal layer 228 has, or defines, the plurality of through holes H1. In each of the plurality of through holes H1, a cross-sectional size of a center region (e.g., a distance between adjacent second metal layers 228b) may be larger than a cross-sectional size of each of both ends (e.g., both a distance between adjacent first metal layers 228a and a distance between adjacent third metal layers 228c).

The first insulating layer 230 covering the first metal layer 228a, and the second insulating layer 231 covering the third metal layer 228c, may be under the sealing member 30. The first and second insulating layers 230 and 231 may have a plurality of fourth and fifth holes h4 and h5, respectively.

The first insulating layer 230 may cover both the first metal layer 228a and a side surface of the second metal layer 228b. The plurality of fourth holes h4 may be two-dimensionally arranged. The plurality of fourth holes h4 may have a same size, or at least two of the plurality of fourth holes h4 may have a different size. Even if at least two of the plurality of fourth holes h4 have a different size, the size of each fourth hole h4 may be smaller than the size of a corresponding first or second hole h1 or h2, and the fourth hole h4 may overlap a partial region of (e.g., may be within, or may be at an interior of) the first and second holes h1 and h2. The fourth hole h4 may be filled with the sealing member 30.

The second insulating layer 231 may be on the first insulating layer 230, and may cover the third metal layer 228c. The plurality of fifth holes h5 may be two-dimensionally arranged. The plurality of fifth holes h5 may each have a same size, or at least two of the plurality of fifth holes h5 may have a different size. Even if at least two of the plurality of fifth holes h5 have a different size, the size of each fifth hole h5 may be smaller than the size of a corresponding third hole h3, and the fifth hole h5 may overlap a partial region of the third hole h3. The fifth hole h5 may be filled with the sealing member 30.

The first and second insulating layers 230 and 231 may be formed of the same material, or may be formed of different materials. As a non-limiting example, the first insulating layer 230 may be formed of the same material as the second gate insulating layer 209, and may be located on the same layer as the second gate insulating layer 209. The second insulating layer 231 may be formed of the same material as the interlayer insulating layer 214, and may be at the same layer as the interlayer insulating layer 214.

A cross-sectional shape of the first to fifth holes h1 to h5 described above may be a quadrangular shape. However, the present embodiment is not limited thereto. As such, the cross-sectional shape of the first to fifth holes h1 to h5 may be a polygonal shape other than the quadrangular shape, a circular shape, an oval shape, or the like. In addition, cross-sectional shapes of corresponding holes may be the same but are not limited thereto.

Because the first and second insulating layers 230 and 231 may cover the first, second, and third metal layers 228a, 228b, and 228c, a hillock phenomenon, and the occurrence of bubbles on the first, second, and third metal layers 228a, 228b, and 228c due to a sudden temperature raise caused by laser beams, may be reduced or prevented. In addition, because the first and second insulating layers 230 and 231 have the fourth and fifth holes h4 and h5, respectively, and the fourth and fifth holes h4 and h5 are filled with the sealing member 30, a bonding strength between the sealing member 30 and the first and second insulating layers 230 and 231 may be improved.

The metal layer 228 under the sealing member 30 may be a structure to improve a mechanical strength through the expansion of an effective bonding area. However, as a cross-sectional size of the metal layer 228 may be larger, a size of the first through holes H1 included in the metal layer 228 may be smaller. In this case, because the first and second insulating layers 230 and 231 are filled in a reduced portion of the first through holes H1, a bonding area between the sealing member 30 and the first and second insulating layers 230 and 231 may be reduced.

Alternatively, when a cross-sectional size of the metal layer 228 is smaller, a defect according to delamination due to electrostatic discharge may occur. As a non-limiting example, when colliding an electrostatic discharge gun with a side surface of the sealing member 30, a current may flow through the metal layer 228, the current causes heat, thermal expansion may occur in the metal layer 228 due to the heat, and a difference in a thermal expansion coefficient may occur on an interface between the sealing member 30 and the metal layer 228. Delamination may occur due to a stress due to the difference in a thermal expansion coefficient.

Because the display apparatus 100 according to an embodiment includes the metal layer 228 of a multi-layer structure, a surface area of the metal layer 228 may be wider than before. Therefore, even if a current flows through the metal layer 228, heat due to the current may be reduced. In addition, because the second hole h2 of the second metal layer 228b may be larger than each of the first and third holes h1 and h3 of the first and third metal layers 228a and 228c, the second metal layer 228b may be stepped from the first and third metal layers 228a and 228c. According to the stepped structure, a mechanical strength may be improved.

Figure 6:
FIG. 6 illustrates a table showing a result of testing whether delamination occurs in display apparatuses according to structures of a metal layer, according to an embodiment.
Figure 6:
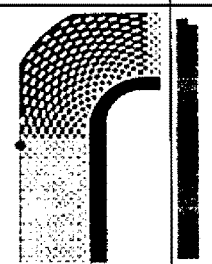
Figure 6:
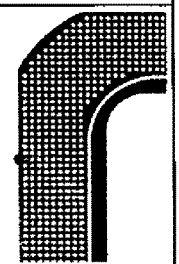

FIG. 6 illustrates a table showing a result of testing whether delamination occurs in display apparatuses according to structures of the metal layer 228, according to an embodiment.

Column A indicates where a metal layer without holes is included under the sealing member 30, column B indicates where the first metal layer 228a is included under the sealing member 30, and column C indicates a case where the first, second, and third metal layers 228a, 228b, and 228c are included under the sealing member 30. The test was conducted at same conditions with respect to a material of the sealing member 30, a substrate, and the like. When a touch according to electrostatic discharge occurs on the sealing member 30, delamination occurred in column A at about +19 KV, delamination occurred in column B at about +8 KV, and delamination occurred in column C at about +10 KV. In addition, when a heating area was checked at $2\times10^{15}$ W/m³, column B was in the lowest heating state.

With respect to delamination due to electrostatic discharge, when no metal exists under the sealing member 30, delamination due to electrostatic discharge may be reduced, but a mechanical strength may be weak. Therefore, the structure of the first, second, and third metal layers 228a, 228b, and 228c according to an embodiment is better to both maintain a certain mechanical strength and reduce delamination due to electrostatic discharge.

Figure 7:
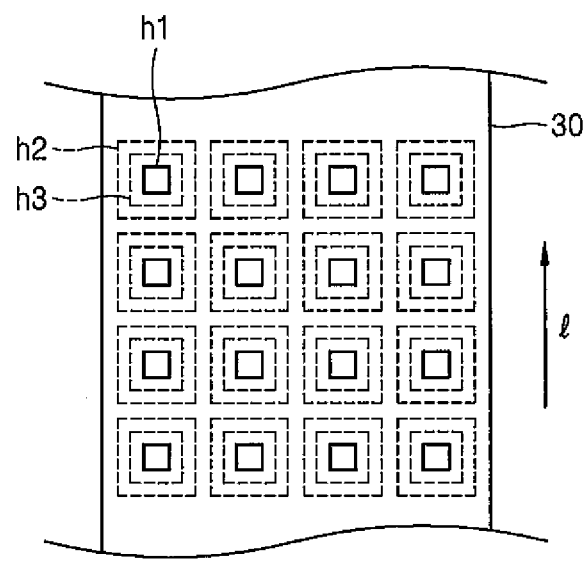
FIG. 7 illustrates a top view showing a structure of first, second, and third metal layers, according to another exemplary embodiment.

FIG. 7 illustrates a top view showing a structure of the first, second, and third metal layers 228a, 228b, and 228c, according to another embodiment. As shown in FIG. 7, sizes of the first, second, and third holes h1, h2, and h3 included in the first, second, and third metal layers 228a, 228b, and 228c may differ from each other. As a non-limiting example, the size of the second hole h2 may be the largest of the three holes h1, h2, and h3, and the third hole h3 may be smaller than the first hole h1. Accordingly, because a surface of the third metal layer 228c is wide, an effective bonding surface may increase.

Figure 8:
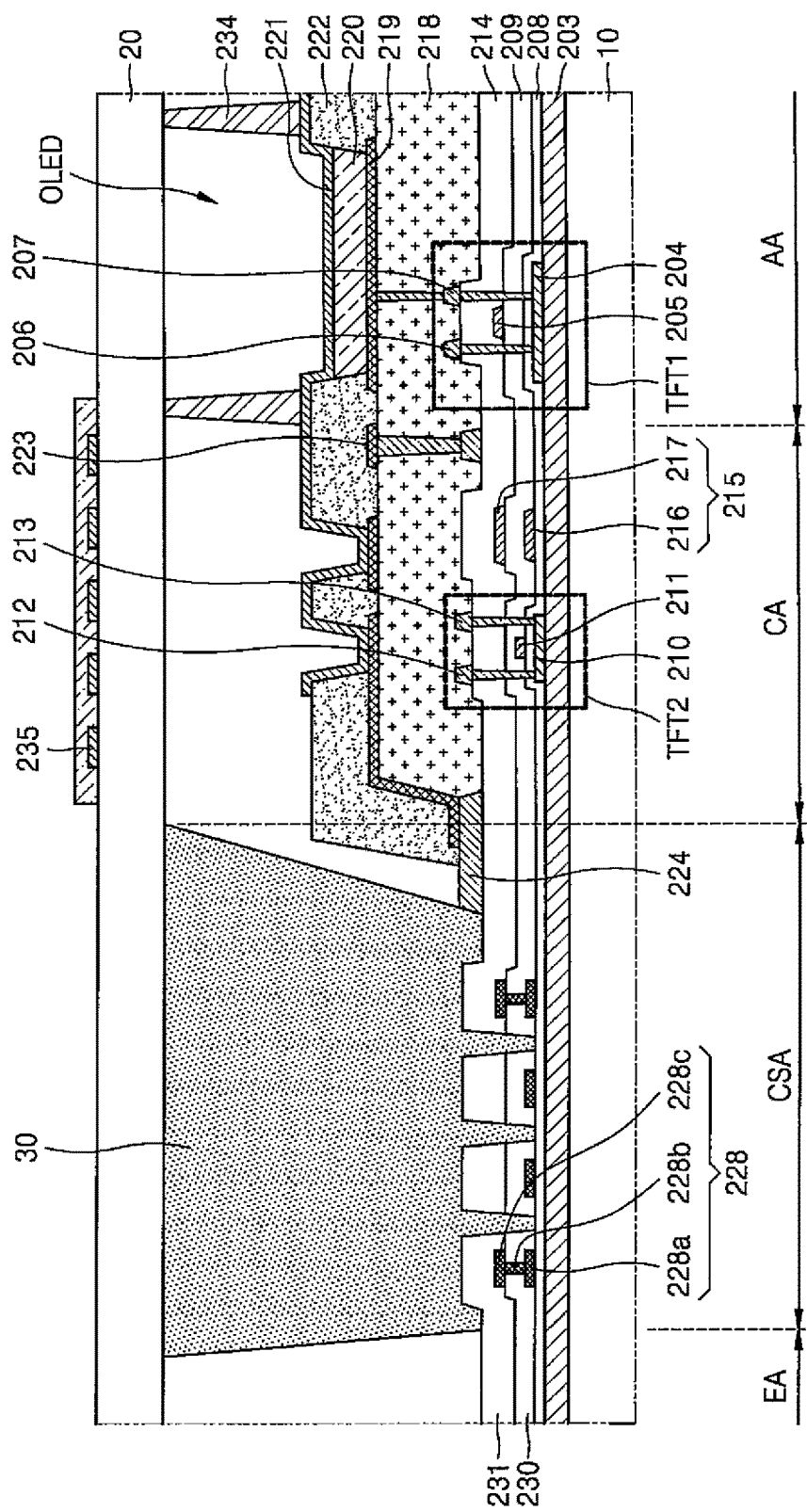
FIG. 8 illustrates a magnified cross-sectional view of a portion of a display apparatus, according to another embodiment.

FIG. 8 illustrates a magnified cross-sectional view of a portion of a display apparatus, according to another embodiment. As shown in FIG. 8, at least one of the second hole h2 of the second metal layer 228b and the third hole h3 of the third metal layer 228c may overlap the plurality of first holes h1 included in the first metal layer 228a. The structure of FIG. 8 may reduce delamination due to electrostatic discharge. The first hole h1 of the first metal layer 228a may overlap the plurality of third holes h3 included in the third metal layer 228c.

It should be understood that embodiments described herein should be considered in a descriptive sense only and not for purposes of limitation. Descriptions of aspects within each exemplary embodiment should typically be considered as available for other similar aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. An organic light-emitting display apparatus comprising:
   a first substrate corresponding to a display area for displaying an image, and a periphery area at which no image is displayed;
   a second substrate facing the first substrate;
   a first metal layer at the periphery area of the first substrate, and defining a plurality of first holes;
   a second metal layer on and directly contacting the first metal layer, and defining a plurality of second holes that are differently sized than the first holes;
   a third metal layer on and directly contacting the second metal layer, and defining a plurality of third holes that are differently sized than the second holes;
   a sealing member bonding the first substrate and the second substrate, and filling a partial region of the first, second, and third holes;
   a first insulating layer covering the first metal layer, surrounding a side surface of the second metal layer, exposing an upper surface of the second metal layer, and defining a fourth hole within the first and second holes; and
   a second insulating layer covering an upper surface of the third metal layer and directly contacting the upper surface of the third metal layer,
   wherein the sealing member fills the fourth hole to directly contact the first insulating layer and is spaced apart from the first, second and third metal layers by the first and second insulating layers, and
   wherein the first, second, and third metal layers are configured to transfer heat to the sealing member by absorbing heat of laser beams or by reflecting laser beams.

2. The organic light-emitting display apparatus of claim 1, wherein a size of one of the second holes is larger than a size of at least one of the first or third holes.

3. The organic light-emitting display apparatus of claim 1, wherein a size of one of the first holes is a same as a size of one of the third holes.

4. The organic light-emitting display apparatus of claim 1, wherein a size of one of the first holes is smaller than a size of one of the second holes, and is smaller than a size of one of the third holes.

5. The organic light-emitting display apparatus of claim 1, wherein at least one of the first and the third holes overlaps one of the second holes.

6. The organic light-emitting display apparatus of claim 1, wherein the first insulating layer comprises a same material as a gate insulating layer at the display area.

7. The organic light-emitting display apparatus of claim 1, wherein a material of the second insulating layer is different from a material of the first insulating layer.

8. The organic light-emitting display apparatus of claim 7, wherein the second insulating layer comprises a same material as an interlayer insulating layer at the display area.

9. The organic light-emitting display apparatus of claim 1, wherein at least two of the first, second, or third metal layers comprise a same material.

10. The organic light-emitting display apparatus of claim 1, wherein at least one of the first, second, or third metal layers comprises a same material as an electrode of a capacitor at the display area.

11. The organic light-emitting display apparatus of claim 1, wherein the second insulating layer defines a fifth hole within one of the third holes, and wherein the sealing member fills the fifth hole to directly contact the second insulating layer in the fifth hole.

12. An organic light-emitting display apparatus comprising:

a first substrate comprising a display area for displaying an image, and a periphery area at which no image is displayed;

a second substrate facing the first substrate;

a metal layer at the periphery area, and defining a plurality of first through holes;

an insulating layer surrounding a side surface of the metal layer, covering an upper surface of the metal layer and directly contacting the upper surface of the metal layer, and defining a second through hole within one of the first through holes; and a sealing member for bonding the first substrate and the second substrate, and filling the second through hole to directly contact the insulating layer, wherein a cross-sectional size of a center region of the first through hole is larger than a cross-sectional size of each of both ends of the first through hole, and wherein the metal layer is configured to transfer heat to the sealing member by absorbing heat of laser beams or by reflecting laser beams and is spaced apart from the sealing member by the insulating layer.

\* \* \* \* \*